United States Patent
Campbell et al.

(10) Patent No.: US 6,462,698 B2
(45) Date of Patent: Oct. 8, 2002

(54) WIRELESS COMMUNICATION SYSTEM USING SURFACE ACOUSTIC WAVE (SAW) SINGLE-PHASE UNIDIRECTIONAL TRANSDUCER (SPUDT) TECHNIQUES

(75) Inventors: Colin K. Campbell, Ancaster (CA); Peter J. Edmonson, Hamilton (CA)

(73) Assignee: Research in Motion Limited, Waterloo (CA)

( * ) Notice: Subject to any disclaimer, the term of this patent is extended or adjusted under 35 U.S.C. 154(b) by 0 days.

(21) Appl. No.: 09/864,507

(22) Filed: May 24, 2001

(65) Prior Publication Data

US 2001/0053179 A1 Dec. 20, 2001

Related U.S. Application Data

(60) Provisional application No. 60/209,153, filed on Jun. 2, 2000.

(51) Int. Cl.$^7$ .............................................. G01S 13/75
(52) U.S. Cl. ............................ 342/51; 342/42; 342/43; 342/50; 342/60; 342/175; 375/147; 375/150; 375/151; 375/152; 375/153
(58) Field of Search ............................... 342/42–52, 60, 342/175, 195, 131, 132, 145, 165–174; 375/145, 146, 147, 149, 150, 151, 152, 153, 130–144, 148; 331/107 A; 333/193; 310/313 R, 313 A, 313 B, 313 D

(56) References Cited

U.S. PATENT DOCUMENTS

| | | | |
|---|---|---|---|
| 4,746,830 A | | 5/1988 | Holland |
| 4,749,964 A | * | 6/1988 | Ash ........................ 331/107 A |
| 5,568,002 A | | 10/1996 | Kawakatsu et al. |
| 5,698,927 A | * | 12/1997 | Tanaka et al. .......... 310/313 A |

(List continued on next page.)

FOREIGN PATENT DOCUMENTS

| | | |
|---|---|---|
| DE | 19638370 A1 | 9/1996 |
| DE | 19724258 A1 | 12/1998 |
| EP | 0797315 A2 | 9/1997 |
| EP | 0800270 A2 | 10/1997 |
| EP | 0872954 A1 | 10/1998 |

OTHER PUBLICATIONS

"High Performance Balanced Type SAW Filters in the Range of 900 MHZ and 1.9GHz", Endoh, G et al., IEEE Ultrasonics Symposium, New York, NY, Oct. 5, 1997, pp. 41–44.

(List continued on next page.)

Primary Examiner—Bernarr E. Gregory
(74) Attorney, Agent, or Firm—Jones, Day, Reavis & Pogue; Charles B. Meyer, Esq.; Krishna K. Pathiyal, Esq.

(57) ABSTRACT

SAW devices such as interdigital transducers (IDTs) have been widely used in RADAR applications and as filters. An IDT produces a SAW when excited by a single electrical pulse and can be fabricated to embody a code, which code provides for a passive autocorrelation of a SAW input to the IDT and thereby lends itself to further application as a signal generator in a communication device. However, conventional SAW expanders and compressors typically have insertion losses greater than 20 dB, which can have a profound effect on an RF link budget in a communication system. Insertion losses are drastically reduced by using a single phase unidirectional transducer (SPUDT-type) instead of a conventional IDT as a SAW expander/compressor. A SPUDT-type reflects SAW components which are lost in conventional IDT designs so that a stronger SAW is directed toward a transmission element. In a receiver, a SPUDT-type directs a stronger SAW toward a compressor IDT. A communication system based on SPUDT-type techniques would be low-cost, low-power, small and simple alternative to known short range communications schemes, including for example the BLUETOOTH™ solution. Operation of a SAW system at a frequency of 2.4 GHz is contemplated.

33 Claims, 10 Drawing Sheets

U.S. PATENT DOCUMENTS

| | | | |
|---|---|---|---|
| 5,790,000 A | | 8/1998 | Dai et al. |
| 5,831,492 A | * | 11/1998 | Solie .......................... 333/193 |
| 5,835,990 A | | 11/1998 | Saw et al. |
| 5,896,071 A | * | 4/1999 | Dai et al. .................... 333/193 |
| 6,194,809 B1 | * | 2/2001 | Takeuchi et al. ......... 310/313 R |
| 6,211,600 B1 | * | 4/2001 | Martin .................... 310/313 D |
| 6,242,844 B1 | * | 6/2001 | Puttagunta et al. ..... 310/313 B |
| 6,255,759 B1 | * | 7/2001 | Takeuchi et al. ........ 310/313 R |

OTHER PUBLICATIONS

Radiation Conductance and Grating Reflectivity Weighting Parameters for Dual Mode Leaky–SAW Resonator Filter Design, Edmonson, P.J. and Campbell, C.K., Department of Electrical and Computer Engineering, McMaster University, Hamilton, Canada, 1994 Ultrasonics Symposium, pp. 75–79.

"Coupling–Of–Modes Studies Of Surface Acoustic Wave Oscillators And Devices", Edmon, P.J., A Thesis Submitte to the School of Graduate Studies in Partial Fulfillment of Requirements for Degree of Doctor of Philosophy, McMaster University, Feb. 1995, pp. 19, 83.

XP–002185586 —"GHz Filters with Third Harmonic Unidirectional Transducers, " R. Huegli—1990 Ultrasonics Symposium, 1990 IEEE pp. 165–168.

XP 000290093 —"Application of Low Loss S.A.W. Filters to RF and IF Filtering in Digital Cellular Radio Systems," Hode, et al.—1990 Ultrasonics Symposium, 1990 IEEE pp. 429–434.

* cited by examiner

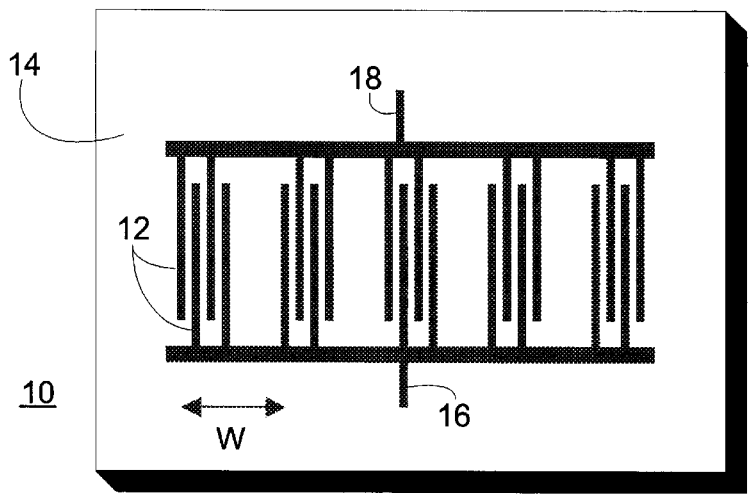
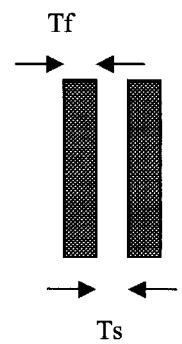
FIG. 1 - PRIOR ART
FIG. 3
PRIOR ART
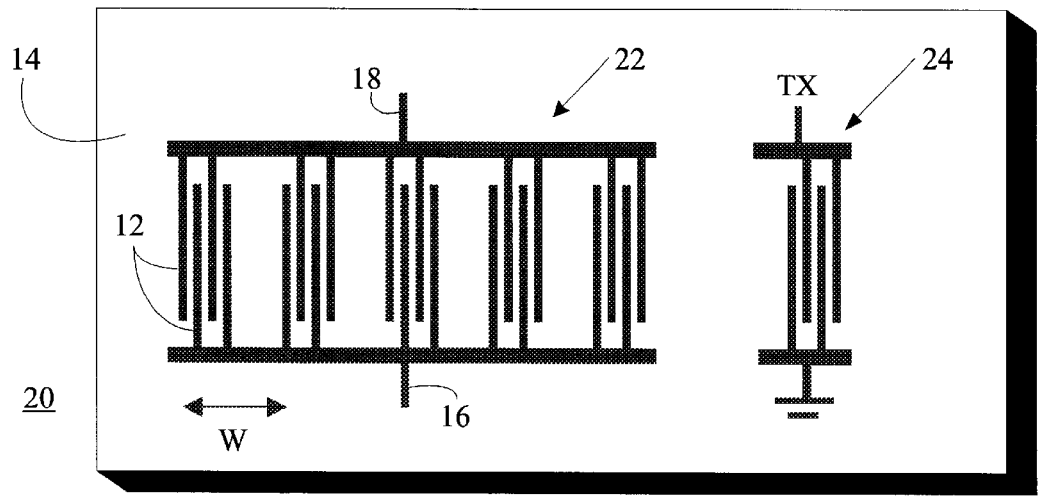
FIG. 2 - PRIOR ART

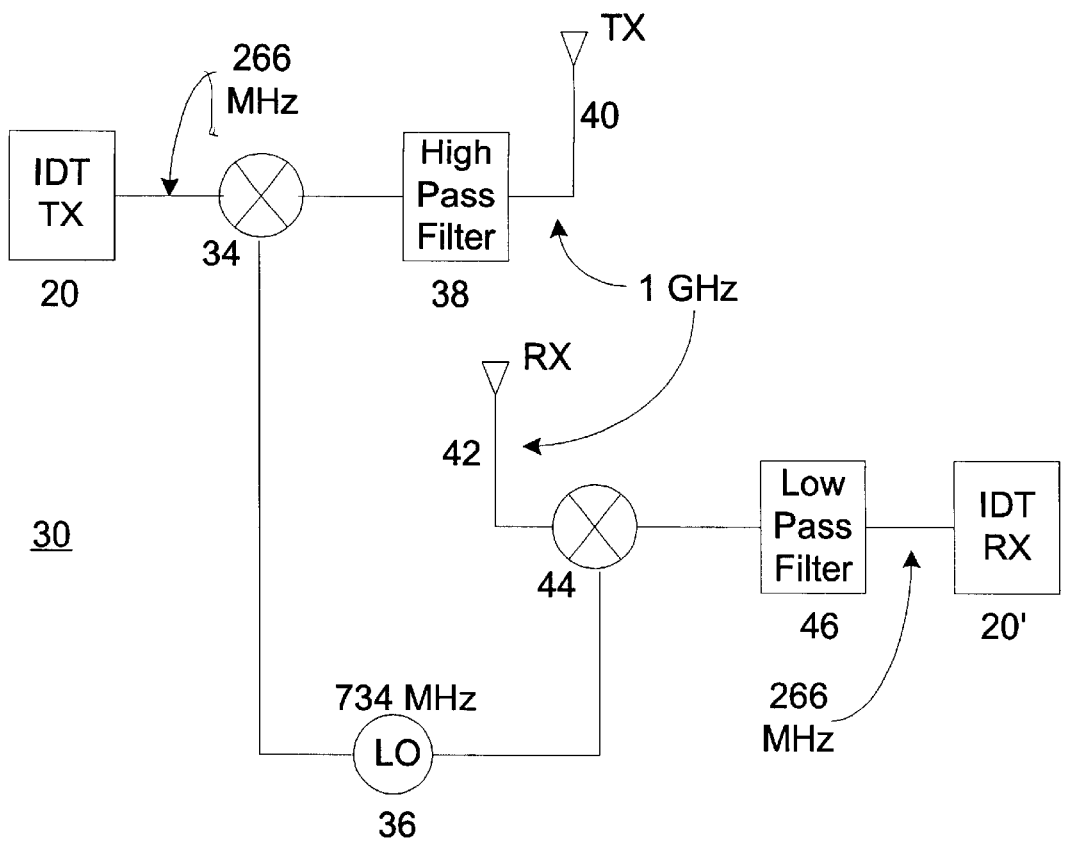
FIG. 4 - PRIOR ART
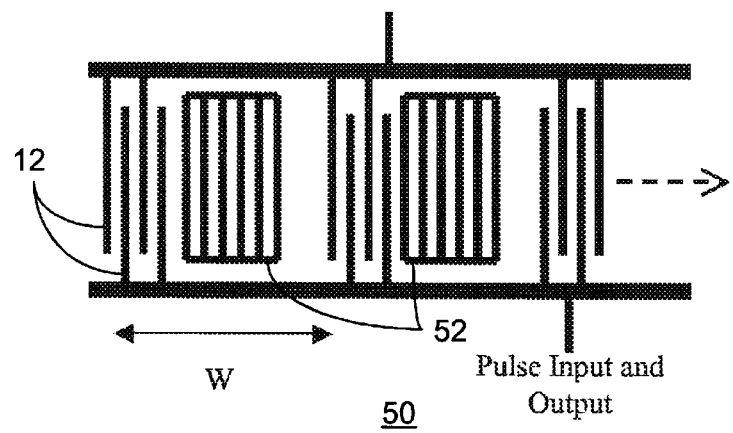
FIG. 5

WIRELESS COMMUNICATION SYSTEM USING SURFACE ACOUSTIC WAVE (SAW) SINGLE-PHASE UNIDIRECTIONAL TRANSDUCER (SPUDT) TECHNIQUES

REFERENCE TO RELATED PATENT

This application claims priority from U.S. Serial No. 60/209,153, filed on Jun. 2, 2000. This prior application, including the entire written description and drawing figures, is hereby incorporated into the present application by reference.

BACKGROUND OF THE INVENTION

1. Field of the Invention

This invention relates to short range communications using surface acoustic wave (SAW) expanders and compressors.

2. Description of the Prior Art

SAW technology is well known for its excellent radio frequency (RF) performance, low cost and small size. SAW is a passive thin film technology that does not require any bias current in order to function. SAW expanders and compressors have been used in RADAR applications for many years.

The basic "building block" of SAW expanders and compressors is the interdigital transducer (IDT) such as shown in FIG. 1. An IDT 10 is a series of thin metal strips or "fingers" 12 fabricated on a suitable piezoelectric substrate 14. One set of fingers is connected to an input/output terminal 16, while the opposite set of fingers is connected to another terminal 18. In single-ended IDTs, terminal 18 is grounded. For differential input signals however, terminal 18 is a pulse input/output terminal. Spacing "W" between IDT segments is adjusted to conform to the desired chip period of the coded sequence. When excited by a narrow electric pulse at terminal 16, the IDT generates a coded output SAW signal that propagates in both directions perpendicular to the fingers 12. If a similarly coded SAW signal impinges on the fingers 12, then an autocorrelation function is performed and a peak, with associated side lobes, is generated at terminal 16. These abilities of SAW expanders and compressors are well known in the prior art, having been demonstrated for example in Edmonson, Campbell and Yuen, "Study of SAW Pulse Compression using 5×5 Barker Codes with Quadraphase IDT Geometries", 1988 *Ultrasonics Symposium Proceedings*, Vol. 1, Oct. 2–5, 1988, pp. 219–222.

Thus, the structure shown in FIG. 1 can operate as both a SAW expander, generating a SAW output from a single pulse input, and a SAW compressor, generating a single pulse or peak output from a SAW input. Terminal 16, as well as terminal 18 in differential IDTs, is both a pulse input terminal and a pulse output terminal. Conversion of an output SAW into an electrical signal for further processing in conventional communications circuits and subsequent transmission through an antenna is accomplished by adding a transmit IDT 24, aligned with the IDT 22, as shown in FIG. 2. Both IDTs can be fabricated on the same substrate 14. A SAW output from IDT 22 is converted into an electrical signal by TX IDT 24. A SAW receiver would have the same structure as in FIG. 2. A signal input to a receive IDT from receiver processing circuitry would be converted to a SAW which is input to IDT 22. Like the IDT 22, the TX IDT 24 may be a differential IDT, wherein the grounded lower terminal would be a pulse output terminal.

The geometry of adjacent IDT fingers 12 is shown in FIG. 3, where Tf is the width of a metallized finger 12 and Ts is the width of the space between the fingers 12. In typical designs both Tf and Ts are equal to a quarter of a wavelength, $\lambda/4$. For example, for a typical SAW system operating in the Industrial, Scientific and Medical (ISM) band at 2.4 GHz the $\lambda/4$ dimension could be in the order of 0.425 microns, depending upon the substrate chosen.

Previous SAW-based communications systems use lower frequency SAW expanders and compressors having larger and further spaced fingers in conjunction with a plurality of components such as mixers and local oscillators, as shown in FIG. 4. In the typical prior art communication system 30, a lower frequency 266 MHz signal generated by transmit IDT 20 is up-converted in mixer 34, which receives a 734 MHz signal from local oscillator 36. The resulting output from mixer 34 is filtered in high pass filter 38 to generate a 1 GHz signal for transmission through antenna 40. On the receive side, the process is reversed in antenna 42, mixer 44, low pass filter 46 and receive compressor IDT 20'. The TX and RX IDTs 20 and 20' have the structure shown in FIG. 2. Undesirably, the mixers 34 and 44, oscillator 36 and filters 38 and 46 from the communications system 30, result in additional cost, power consumption, occupation in space and a much complex system than is desired for low-cost, low power, short range communication systems. Therefore, there remains a need in the art to reduce the number of components in such a communication system. Previously-reported designs of encoded IDT structures have employed split-electrodes of width $\lambda/8$ within each chip segment W to suppress spurious IDT finger reflections (See, for example, M. G. Holland and L. T. Claiborne, "Practical Surface Acoustic Wave Devices", *Proceedings of the IEEE*, Vol. 62, pp. 582–611, May 1974). In contrast, SPUDT-type reflection gratings can be placed judiciously to enhance spurious IDT finger reflections and thereby reduce device insertion loss. These SPUDT techniques have previously been applied to realize low-loss SAW filters, where all of the IDT segments within each section W of the structure have the same polarity (See, for example, 1) C. K. Campbell and C. B. Saw, "Analysis and Design of Low-loss SAW Filters using Single-Phase Unidirectional Transducers", *IEEE Transactions on Ultrasonics, Ferroelectrics and Frequency Control*, Vol. UFFC-34, pp. 357–367, May 1987; and 2) C. Campbell, *Surface Acoustic Wave Devices and their Signal Processing Applications*, Boston: Academic Press, 1989). These SPUDT-type enhancement techniques have not been previously applied to encoded IDTs.

High-frequency communication techniques involving more conventional non-SAW based circuits and systems also exist. BLUETOOTH™ wireless technology is one such prior art example. BLUETOOTH™ is a de facto standard, as well as a specification for small-form factor, low-cost, short range radio links between mobile PCs, mobile phones and other portable wireless devices. The current BLUETOOTH™ short range communications specification operates in the 2.4 GHz (ISM) band; however, the BLUETOOTH™ standard in its current infancy undesirably involves high cost, substantial power consumption and relatively complex hardware.

Although high frequency SAW expanders and compressors offer significant reductions in cost, power consumption, size and complexity over prior SAW-based and non-SAW based communications systems, conventional SAW expanders and compressors typically have insertion losses greater than 20 dB. This may affect the RF link budget of a communication system, as more gain would have to be designed into the system for satisfactory operation. Therefore, there remains a need for a SAW SPUDT-type expander and compressor that would improve the insertion loss and positively impact the RF link budget and complexity of the system and thereby make RF communications systems in which RF signals are generated and processed directly and solely by SAW expanders and compressors feasible.

SUMMARY OF THE INVENTION

An object of the present invention is overcome at least some of the drawbacks of the prior art.

Advantageously, the use of low loss SPUDT-type SAW devices as described in the present invention offers improved performance compared to conventional SAW devices in respect to generation of coded RF waveforms (expander) and the autocorrelation of coded RF waveforms (compressor) for communication systems.

It is therefore an object of the invention to provide a low cost SPUDT-type SAW-based communication method and system. As an illustrative example of the cost reduction resulting from the present invention, SAW devices used for filtering at near-ISM band frequencies may cost approximately $1.00 each. In contrast, a comparable semiconductor BLUETOOTH™ solution may cost more than $10.00.

It is a further object of the invention to provide SPUDT-type SAW-based transmit and receive units that are easily manufactured. The manufacturing required for the present invention allows for SAW fabrication that utilizes simple, single layer photolithographic techniques.

Another object of the invention is to provide a low power SPUDT-type SAW solution for short range communications. The SPUDT uses passive thin film technology and requires only a pulse to excite and produce a coded RF waveform. Likewise it can perform an autocorrelation function passively. This compares to prior SAW techniques which require frequency conversion circuitry such as mixers, filters and oscillators, and the complex BLUETOOTH™ techniques that require separate receive, transmit and processing circuitry. In mobile communication environments, power consumption and size are of primary importance.

A still further object of the invention is to provide a SPUDT-type SAW-based communication arrangement that occupies minimal space. A complete SAW package in accordance with the invention is in the order of 3 mm×3 mm.

In an embodiment of the invention, a communication system comprises an expander SPUDT-type IDT which is configured to embody a code and thereby produces a coded SAW output when excited with an electric pulse, a transmit IDT positioned adjacent to the expander IDT and connected to an antenna, a receive IDT connected to the antenna, and a compressor SPUDT-type IDT, positioned adjacent to the receive IDT, which is configured to embody the code and thereby produces an electric pulse output when excited by a coded SAW input. A further aspect of the invention involves the use of a SPUDT-type IDT as the transmit IDT and the receive IDT.

Wireless communication systems according to the invention may be installed in both a wireless mobile communication device and a wireless earpiece detachable therefrom, to provide for communication between the mobile device and the earpiece. In a further embodiment of the invention, a SAW-based wireless communication system is installed in a wireless mobile communication device, a wireless earpiece detachable therefrom and a holder for the mobile device connected to a personal computer (PC), to provide for communication between the device and the PC through the holder, the device and the earpiece, and the earpiece and the PC through the holder.

The transmit IDT receives the coded SAW output from the expander IDT and produces a coded electric output signal for transmission via the antenna, and the receive IDT produces the coded SAW input to the compressor IDT from a coded electric signal received via the antenna. The electric input and output signals associated with any of the IDTs may be either unbalanced or differential signals.

In another inventive aspect, a passive wireless communication system comprises an antenna for converting received communication signals into electric antenna output signals and for converting electric antenna input signals into communication signals, a first IDT connected to the antenna and configured to produce a SAW output when a communication signal is received by the antenna, a second coded SPUDT-type IDT positioned adjacent to the first IDT and configured to produce an electric signal output when excited by the SAW output from the first IDT and to produce a coded SAW output when excited by an electric signal input, and a termination circuit connected across the terminals of the second IDT, wherein the termination circuit causes the second IDT to reflect a coded SAW output toward the first IDT in response to the SAW output produced by the first IDT, and the first IDT produces a coded electric signal as an antenna input signal in response to the reflected coded SAW output from the second IDT. The termination circuit is preferably either a short circuit connection or an open circuit.

Such a passive wireless communication system may include a SPUDT-type IDT as the first IDT. The first and second IDTs may also have differential electrical signal input and output terminals. Where the code embodied by the second IDT represents identification information or other information relating to an article with which the passive communication system is associated, the passive system may be incorporated into an identification tag, an adhesive label or an equipment nameplate. The passive wireless system preferably receives communication signals from a remote interrogation system, and through operation of the IDTs and termination circuit, automatically and passively responds to the remote interrogation system.

The code embodied by an IDT may be a Barker code such as a 5-bit or 13-bit Barker code, and may be used for example to represent identification information for an article with which the wireless communication system is associated.

According to a further aspect of the invention, a coded SPUDT-type IDT comprises a pair of substantially parallel electrically conductive rails, one or more groups of interdigital elements, each group comprising a plurality of interdigital elements, and one or more SAW reflectors. Each interdigital element is connected to one of the rails and extends substantially perpendicular thereto toward the other rail, and the particular code embodied by such an IDT is determined by a connection pattern of the interdigital elements in each group. A coded SPUDT-type compressor IDT performs a passive autocorrelation function on the coded SAW input based on the code to thereby produce the electric pulse output. A reflector in a SPUDT-type IDT may comprise a plurality of reflector grating elements, wherein the reflector grating elements of a reflector may be either open circuited or are connected to the other grating elements in the same reflector.

A SPUDT-type SAW system according to the invention may be employed in the design of virtually any new short range wireless communication system, for example to enable communication between an earpiece unit and an associated mobile communications device. The inventive systems may also replace RF signal generation circuitry in existing short range communications system, including for example BLUETOOTH™ systems. A further system in accordance with the invention may be employed in "smart" identification tag systems and remote interrogation systems such as inventory systems and meter reading/telemetry systems.

Further features of the invention will be described or will become apparent in the course of the following detailed description.

BRIEF DESCRIPTION OF THE DRAWINGS

In order that the invention may be more clearly understood, preferred embodiments thereof will now be described in detail by way of example, with reference to the accompanying drawings, in which:

FIG. 1 shows an IDT;

FIG. 2 is a block diagram of a conventional SAW-based transmit IDT;

FIG. 3 is an illustration of typical finger geometry in an IDT;

FIG. 4 is a block diagram of a prior art SAW-based communication system;

FIG. 5 is a SPUDT-type expander/compressor;

DETAILED DESCRIPTION OF THE PREFERRED EMBODIMENT

Figure 6:
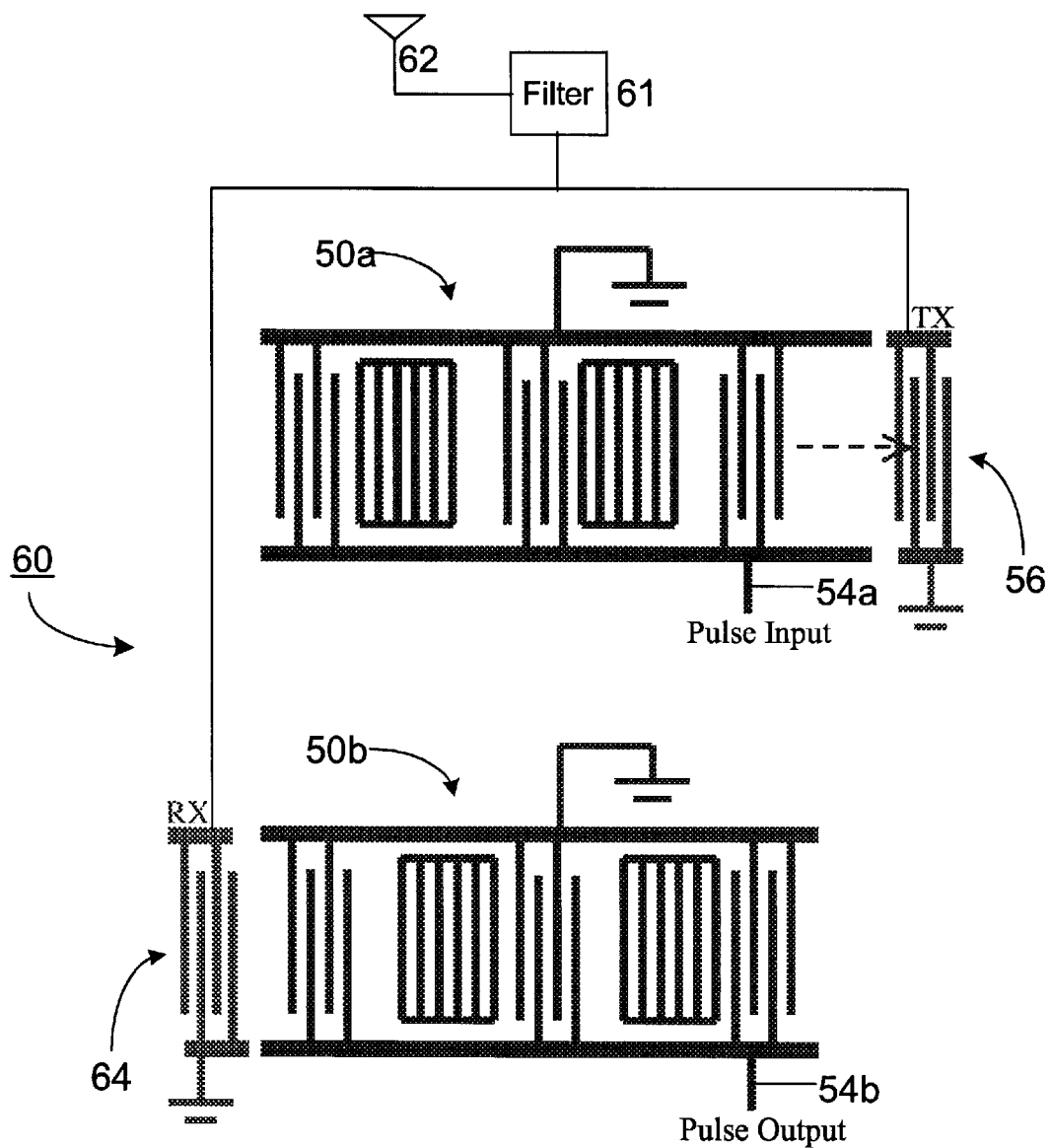
FIG. 6 illustrates a first embodiment of the invention.

The configuration shown in FIG. 5 illustrates the layout geometry of an IDT using reflector gratings 52 to form a SPUDT 50. The dimension for each finger 12, space and reflector 52 is $\lambda/4$ (see for example C. K. CAMPBELL, *Surface Acoustic Wave Devices for Mobile and Wireless Communications*, Boston, Mass.: Academic Press, 1998, Chapter 12). In FIG. 5 and subsequent drawings, the substrate 14 has been omitted for clarity, but it is to be understood that IDT structures may be fabricated on a common substrate.

In comparison to the IDT 10 shown in FIG. 1, the SPUDT 50 operates in a similar fashion to produce a SAW in response to a pulse at the pulse input/output terminal. Each set of fingers 12 produces a SAW that propagates in both directions perpendicular to the fingers. However, the reflector gratings 52 in SPUDT 50 reflect any SAWs impinging thereon and propagating in a direction from the right hand side to the left hand side of FIG. 5 in the opposite direction, from left to right. The spacing of reflector gratings 52 and fingers 12 prevents destructive interference between the reflected waves and waves produced by the fingers 12 which propagate in the desired direction. For optimum performance, the SPUDT reflector gratings are placed judiciously with respect to adjacent IDTs. This placement selection is dependent on whether the reflection gratings are open or short circuited, as well as on the piezoelectric substrate type involved.

Thus, the SPUDT 50 outputs a much higher power SAW propagating in the direction indicated by the arrow in FIG. 5. The "right to left" SAW produced by the leftmost set of fingers 12 in FIG. 5 is the only SAW component which does not contribute to the SAW output in the indicated direction. In the transmitter of FIG. 2, roughly half of the total signal power generated in the expander/compressor 22 propagates toward the TX IDT 24. The upper terminal in FIG. 5 may be either grounded, in single-ended designs, or connected as a pulse input/output terminal in differential designs.

In the SPUDT 50 shown in FIG. 5, each of the three groups of fingers includes four fingers. Starting at the left hand side of the Figure, the first finger of each of the first two sets is attached to the top rail, but in the third set, the first finger is attached to the bottom rail. This indicates a 180° phase shift as what is derived from a ++− configuration.

According to a first embodiment of the invention as shown in FIG. 6, a SAW-based communication system 60 has a SPUDT-type expander 50a, a transmit (TX) IDT 56, a SPUDT-type compressor 50b and a receive (RX) IDT 64. These structures are in-line with each other as shown in FIG. 6. As discussed above in relation to FIG. 2, these structures may be placed on a suitable piezoelectric substrate using thin film lithographic procedures.

With the SPUDT-type expander 50a, a directional acoustic wave propagates towards the TX IDT 56. This will improve the insertion loss of the device, as any acoustic waves generated by the centre and rightmost groups of fingers propagating away from TX IDT 56, which normally would be lost, are reflected back towards the TX IDT 56 by the reflection gratings in expander 50a.

A narrow pulse which represents digital data and can be generated by using simple digital circuitry or an existing data source is injected into the SPUDT 50a of FIG. 6 through pulse input and output terminal 54a to activate a piezoelectric effect that converts electrical to mechanical (acoustic wave) motion. The acoustic waves are coded depending on the geometry of the SPUDT 50a. These acoustic waves then propagate within the substrate to the TX IDT 56. The coded acoustic waves are then transformed to an electrical coded RF signal within the proximity of the TX IDT 56. When the TX IDT 56 is attached to a suitable antenna 62 through the band pass filter 61, the coded RF signal can propagate throughout the air. Feedback of the transmit signal to the RX IDT 64 through its antenna connection does not interfere with the SPUDT-type expander 50a, since the RX IDT 64 is not aligned therewith. Pulse output 54b is not read during signal transmission to prevent erroneous data detection.

A coded electrical signal that enters the RX IDT 64 via antenna 62 and band pass filter 61 generates an acoustic wave that propagates towards the SPUDT-type compressor 50b. An autocorrelation function is passively performed in the SPUDT 50b and if the coded waveform from the RX IDT 64 matches with the code on the SPUDT 50b, a peak is generated at the pulse output terminal 54b. The reflection gratings in compressor 50b enhance conversion of the SAW from RX IDT 64 into electrical energy. Although a signal received at antenna 62 is split between the TX IDT 56 and the RX IDT 64, the SAW generated at TX IDT 56 causes no interference with the receive compressor 50b. Any pulse output on terminal 54a during a receive operation is ignored.

The peak produced by the SPUDT-type compressor 50b can represent digital data. For example, in accordance with an on-off keying technique, following an intialization or synchronization sequence, the presence of a peak within a bit period may be interpreted as a '1' data bit, whereas the absence of a peak would represent a '0' bit.

The coding of the SPUDT-type expander 50a and compressor 50b and the associated autocorrelation function performed by the SPUDT as discussed above are determined by the finger geometry of the SPUDT. A preferred coding scheme is a Barker code. Barker codes are particularly useful for IDT coding, since they minimize the energy in side lobes associated with a compressed pulse generated by the autocorrelation function performed on a SAW input to an expander/compressor IDT. The SPUDTs 50a and 50b as shown in FIG. 6 are coded with a ++− Barker code.

Figure 7:
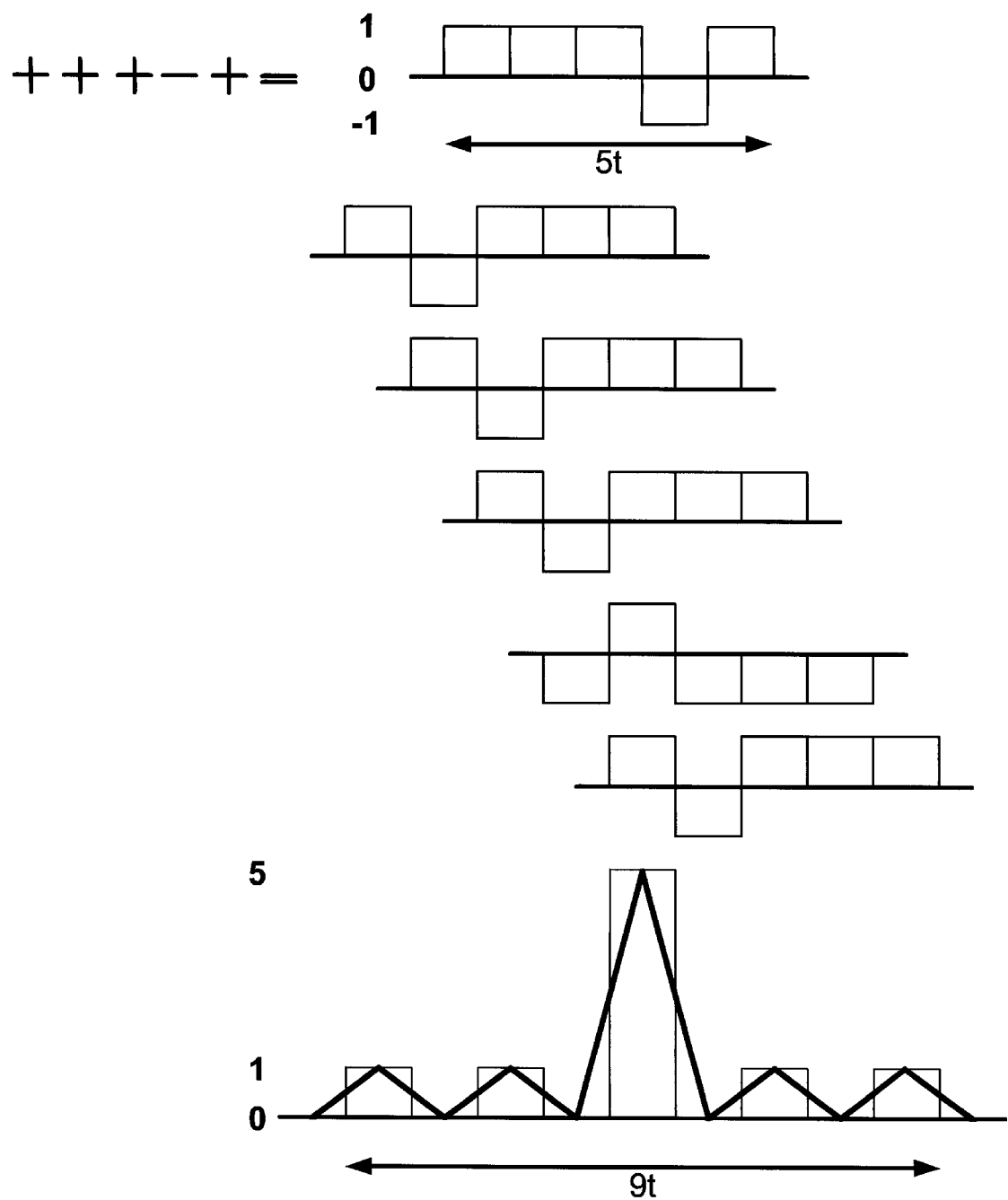
FIG. 7 illustrates an autocorrelation function of a 5 bit Barker code.

FIG. 7 shows an example of the autocorrelation function relating to a 5 bit Barker code (+++−+) performed by an expander/compressor SPUDT or IDT when a received signal is converted to a SAW by a receive IDT such as RX IDT 64. The autocorrelation function is mathematically equivalent to a series of shift and add operations as shown in FIG. 7 and generates the peak and associated side lobes shown at the bottom of FIG. 7 if the received signal was generated with an identically-coded SPUDT or IDT. The amplitude of the autocorrelation peak is proportional to the code length N, which is 5 in the example shown in FIG. 7, whereas the side lobes are amplitude 1.

In the system of FIG. 6, only the SPUDTs 50a and 50b must be coded. As discussed above, Barker codes are preferred. Since the amplitude of the autocorrelation peak generated when a received signal is compressed by a Barker-coded expander/compressor IDT is dependent on the length N of the Barker code, higher-length codes are most preferred. For example, the maximum length known Barker code with N=13 (+++++−−++−+−+) will generate an autocorrelation waveform similar to that shown in FIG. 7, but having a peak of amplitude 13 and additional side lobes with amplitude 1.

Figure 8:
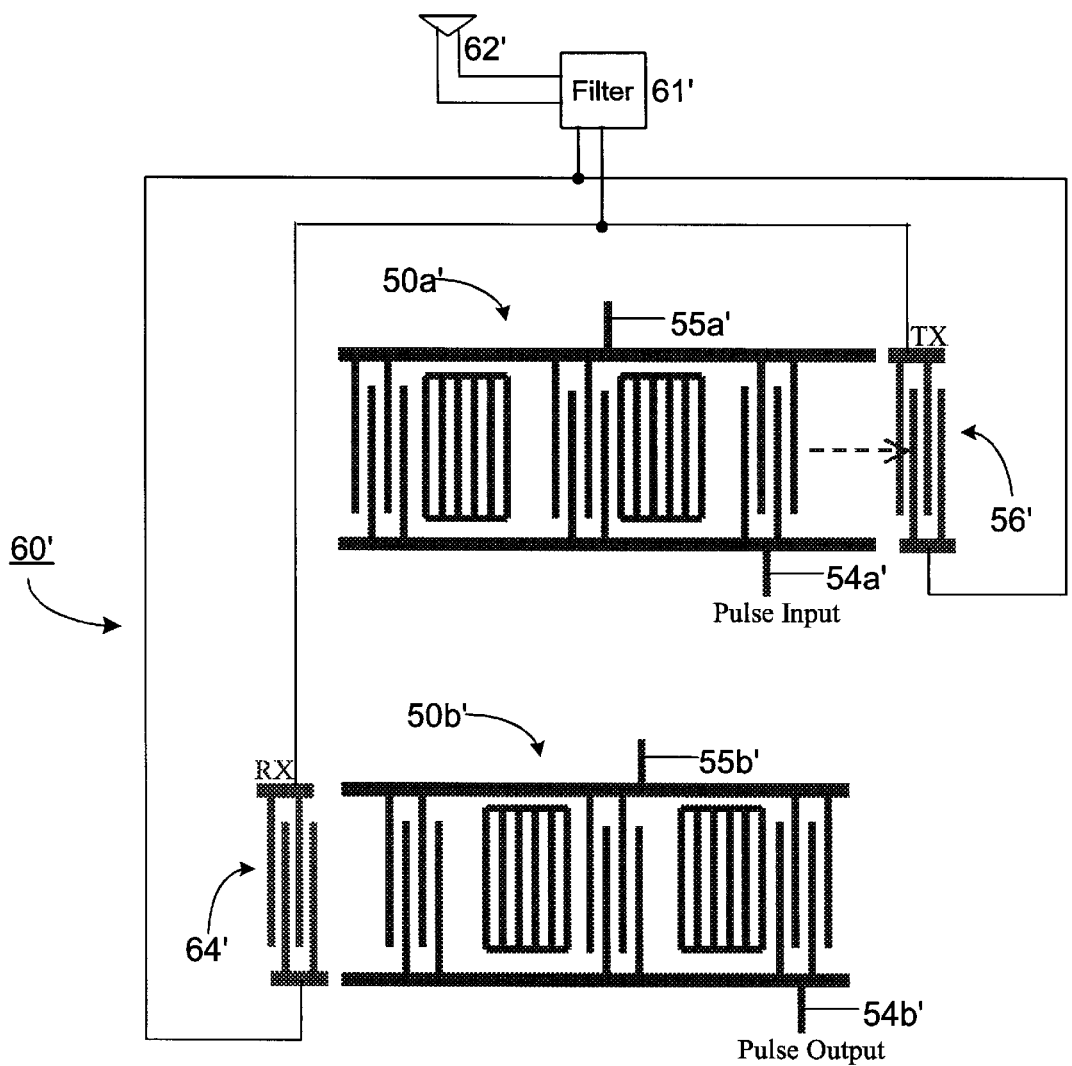
FIG. 8 is a differential implementation of the system of FIG. 6.

FIG. 8 shows a differential design of the system of FIG. 6. In a differential system, both the upper and lower sets of fingers in the TX IDT 56' and RX IDT 64' are connected to antenna 62' and band pass filter 61'. As indicated by the multiple connections in FIG. 8, the filter 61' and antenna 62' must also be differential components. Expander SPUDT 50a' and compressor SPUDT 50b' may be single-ended, with terminals 55a' and 55b' grounded as shown in FIG. 6, or differential, wherein terminal 55a' is a pulse input terminal and terminal 55b' is a pulse output terminal. The differential system in FIG. 8 operates similarly to the system of FIG. 6, as will be apparent to those skilled in the art.

Figure 9:
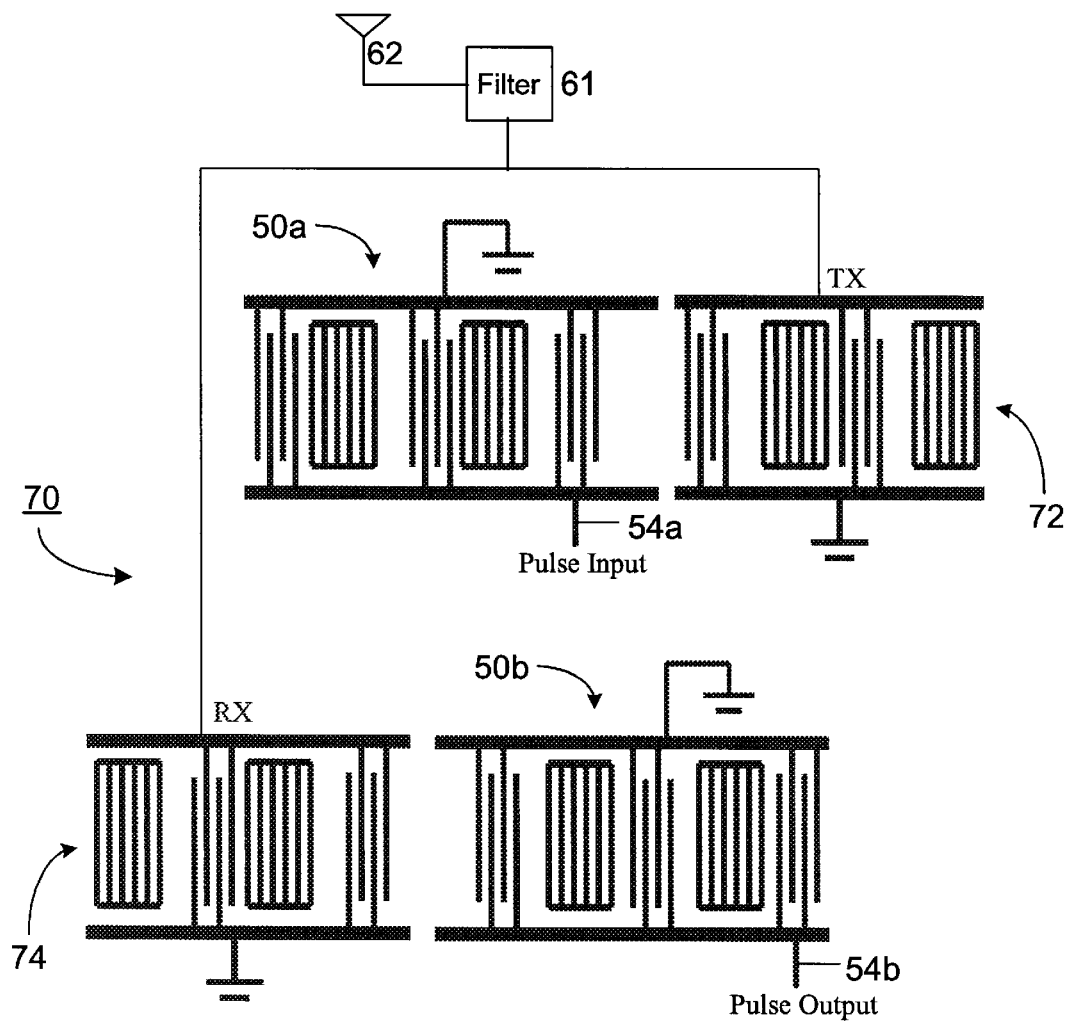
FIG. 9 shows a variation of the first embodiment.
Figure 10:
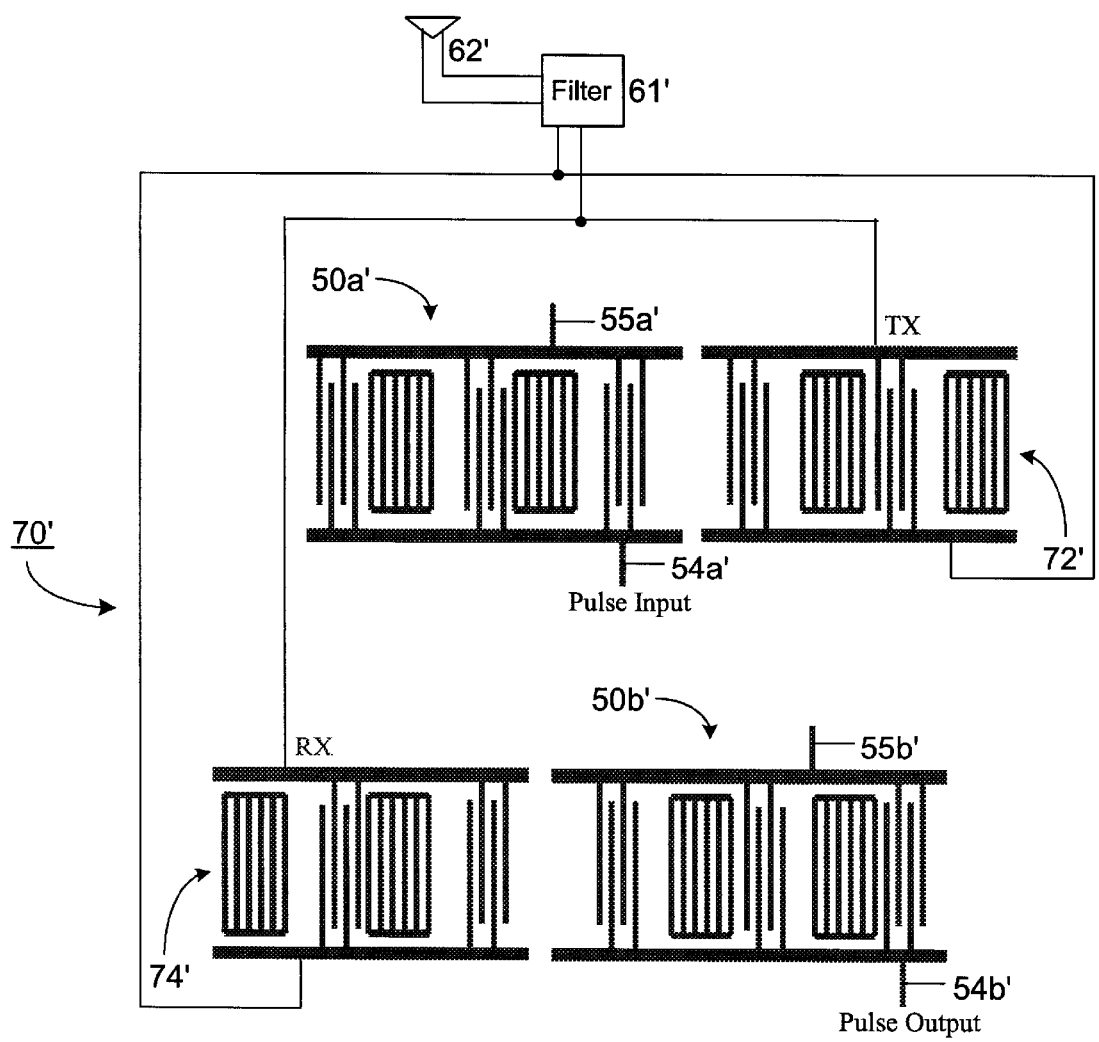
FIG. 10 is a differential implementation of the system of FIG. 9.

Major advantages of a SPUDT over an IDT in a SAW-based communication system include the direction of significantly more of the acoustic waves generated by an expander toward the transmit element, TX IDT 56 for example, as well as improved conversion of input SAW mechanical energy into electrical energy. The SPUDT design technique can effect a significant reduction in device insertion loss and thereby enhance signal-processing performance. This same principle may also be exploited on the transmit and receive sides of a communication system, as shown in FIG. 9. In the system of FIG. 9, the transmit IDT and the receive IDT are SPUDT-type IDTs 72 and 74, which include reflection gratings. TX SPUDT 72 improves conversion of the SAW output by expander SPUDT 50a to an electrical signal. Also, when a pulse is received through antenna 62 and filter 61, the RX SPUDT 74 transmits a stronger SAW toward SPUDT-type compressor 50b. FIG. 10 shows a differential implementation of the SPUDT-type system of FIG. 9.

The inventive arrangements disclosed above can reduce the cost, power consumption, size and complexity of virtually any short range communications system. This SAW based technology will allow communication devices to be placed in power sensitive applications such as a wireless earpiece to allow the user a longer "talk-time" over BLUETOOTHT™ devices.

SPUDT-type SAW-based communication systems according to the first embodiment of the invention may be incorporated into short range communication systems, including any situation for which BLUETOOTH™ was designed.

Figure 11:
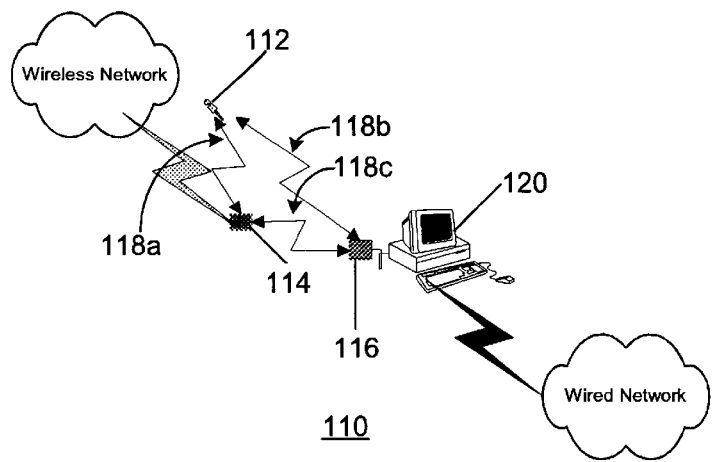
FIG. 11 represents a system in which the invention could be implemented.

An illustrative example of a system into which the inventive wireless communication system could be incorporated is shown in FIG. 11, wherein 112 denotes an earpiece, 114 is a mobile wireless communication device and 116 is a holder or cradle for holding the device 114 and coupling device 114 to a personal computer (PC) 120. In system 110, the earpiece 112, device 114 and cradle 116 incorporate a SAW communication device as disclosed above. This allows a user to communicate audibly between the wireless communication device 114, which may for example be carried on their belt or person, and the wireless earpiece 112 with a built-in microphone, as indicated at 118a in FIG. 11. This system could be then expanded to include communication between the earpiece 112 and the personal computer 120, as indicated by 118b, when a SAW system in cradle 116 is attached to the PC via a bus connection. This system may then be further expanded to include network communications designated 118c in FIG. 11 between the wireless device 114 on the belt or person with the PC 120 to incorporate connectivity via small pico-cell networks. A further extension of the communication systems according to the first and second embodiments could be a personal area network (PAN) based on SAW technology rather than the more excessive BLUETOOTH™ strategy.

Figure 12:
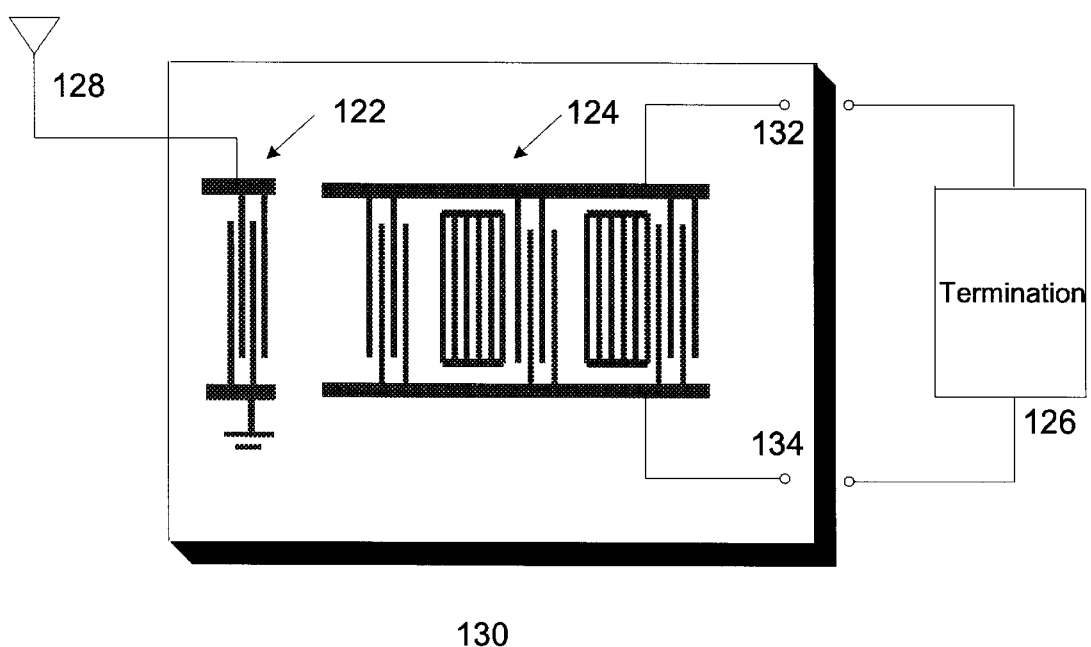
FIG. 12 illustrates a second embodiment of the invention.

In a second embodiment of the invention, the SPUDT design techniques discussed above are applied to passive SAW RF systems. In such systems, SAW devices usually perform only as RF expanders. As shown in FIG. 12, such a passive system 130 comprises two IDTs 122 and 124. A pulse that has been sent out by a local requesting unit is received at the antenna 128 and excites IDT 122 to produce an acoustic wave. This wave then propagates to a SPUDT-type coded IDT 124 that has a suitable termination 126 connected across its terminals 132 and 134 to produce a reflection coefficient of magnitude 1. Termination 126 could be an open or short circuit termination, which will reexcite the coded SPUDT-type IDT 124 to produce a coded acoustic wave back to the IDT 122 that is connected to the antenna 128. The result is that an impulse sent out by a local requesting unit excites a coded SPUDT which then returns back to the requesting unit a coded RF waveform.

At the requesting unit, autocorrelation of the coded waveform returned from the device 130 would preferably be performed by a DSP or other conventional signal processing circuitry, such that different codes can be used for different SPUDT-type IDTs such as IDT 124. In order for the requesting unit to passively perform the autocorrelation, a separate coded IDT must be provided in the requesting unit for each different code embodied in all devices 130 with which communication is desired. This would severely limit the number of devices 130 that could be deployed.

The size of the complete SAW device 130, as discussed above, could be on the order of 3 mm square. This would allow the device to be incorporated into labels such as shipping or address labels, equipment nameplates, adhesive stickers such as vehicle license plate stickers and other forms of identification tags. The code embodied in the SPUDT 124 could for example be a code that provides information about an item to which the device 130 is attached. Device 130 could therefore be implemented in an identification or location system for example.

Figure 13:
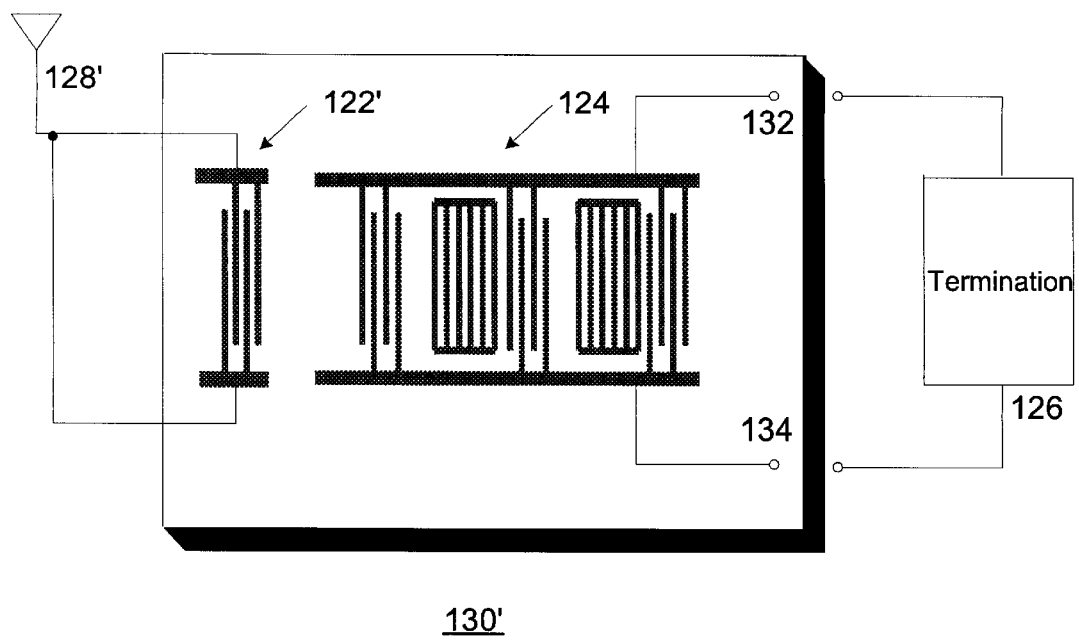
FIG. 13 is a differential implementation of the second embodiment.
Figure 14:
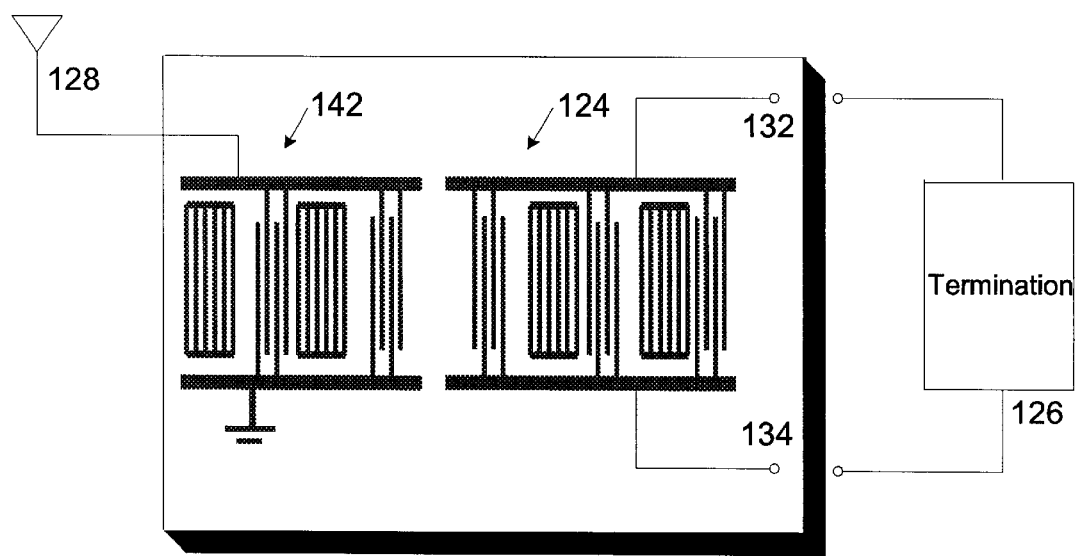
FIG. 14 is a variation of the second embodiment.
Figure 15:
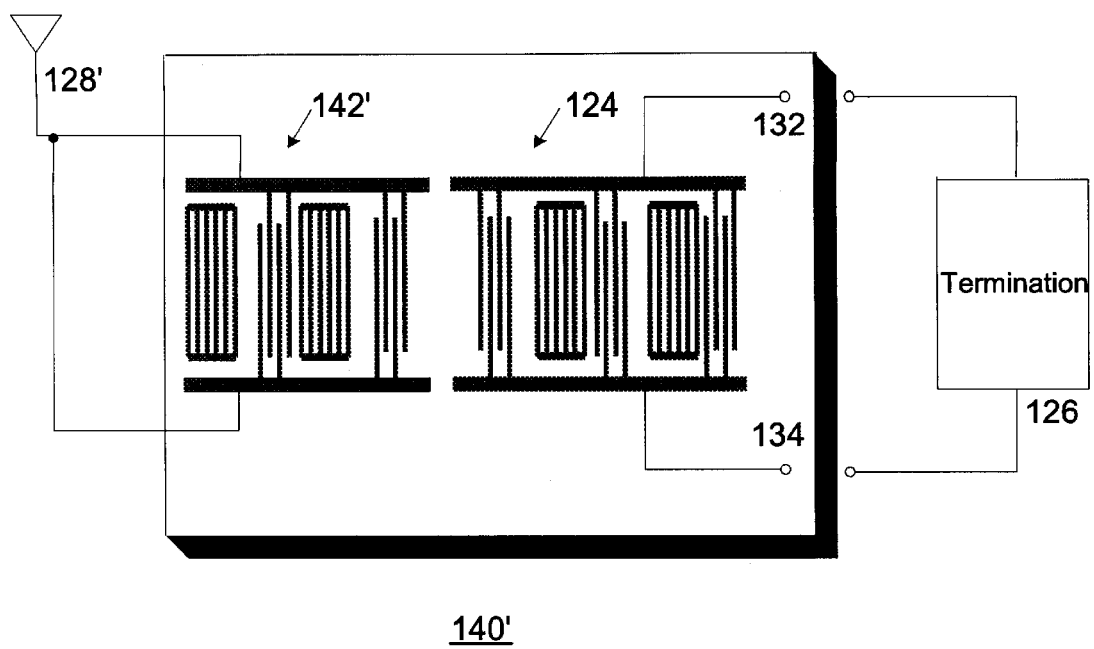
FIG. 15 is a differential implementation of the system of FIG. 14.

Although IDT 122 in FIG. 12 is a single-ended IDT, a differential design is also contemplated, as shown in FIG. 13. In addition, the IDT connected to the antenna 128 could also be a SPUDT-type IDT as in FIGS. 14 and 15.

Figure 16:
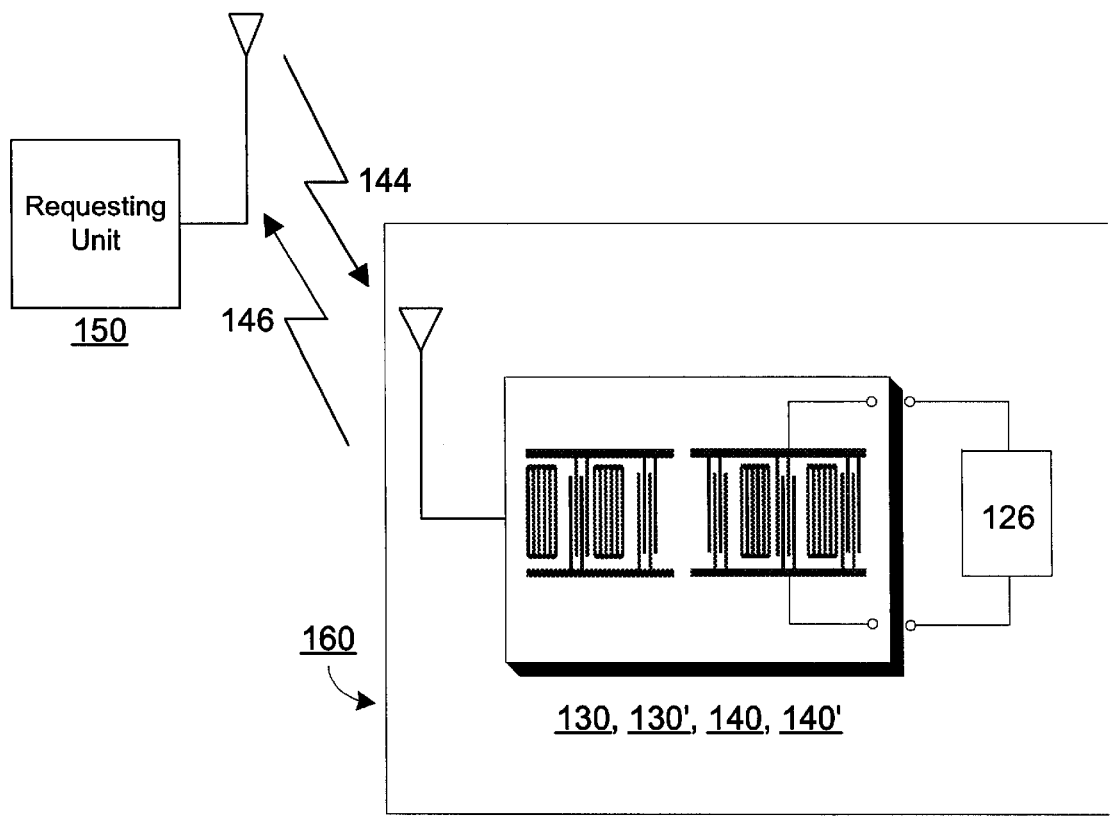
FIG. 16 represents a block diagram of a system in which the second embodiment could be employed.

FIG. 16 shows a system into which passive SAW RF devices according to the third embodiment of the invention could be implemented. A requesting unit 150, which may for example be a hand-held unit with a display or part of a larger interrogation and tracking system, sends an RF pulse 144 to a label, tag or the like generally indicated at 160. The tag 160 includes a SAW device 130, 130', 140 or 140' and may be attached to or placed on or inside an item. The coded return signal 146 generated by the SAW device in tag 160, is received at the requesting device and processed to determine tag information. The information thus determined may for example be displayed to a user or operator of the requesting device 150, forwarded from the requesting unit 150 to an information, tracking or billing system for further processing, or both.

It will be appreciated that the above description relates to preferred embodiments by way of example only. Many variations on the invention will be obvious to those knowledgeable in the field, and such obvious variations are within the scope of the invention as described and claimed, whether or not expressly described.

What is claimed as the invention is:

1. A wireless communication system comprising:
   a. an expander single phase unidirectional transducer (SPUDT) type interdigital transducer (IDT) which is configured to embody a code and thereby produces a coded SAW output when excited with an electric pulse;
   b. a transmit IDT positioned adjacent to the expander IDT and connected to an antenna;
   c. a receive IDT connected to the antenna; and
   d. a compressor SPUDT-type IDT, positioned adjacent to the receive IDT, which is configured to embody the code and thereby produces an electric pulse output when excited by a coded SAW input.

2. The wireless communication system of claim 1, wherein the receive IDT is a SPUDT-type IDT.

3. The wireless communication system of claim 1, wherein the transmit IDT is a SPUDT-type IDT.

4. The wireless communication system of claim 1, wherein the expander IDT, the compressor IDT, the transmit IDT and the receive IDT operate at a frequency of 2.4 GHz.

5. The wireless communication system of claim 1, installed in both a wireless mobile communication device and a wireless earpiece detachable therefrom to allow communication between the mobile communication device and the earpiece.

6. The wireless communication system of claim 1, installed in a wireless mobile communication device, a wireless earpiece detachable therefrom and a holder for the mobile communication device connected to a personal computer (PC), to allow communication between the mobile communication device and the PC through the holder, the mobile communication device and the earpiece, and the earpiece and the PC through the holder.

7. The wireless communication system of claim 1, wherein the transmit IDT receives the coded SAW output from the expander IDT and produces a coded electric output signal for transmission via the antenna, and the receive IDT produces the coded SAW input to the compressor IDT from a coded electric signal received via the antenna.

8. The wireless communication system of claim 1, wherein the transmit IDT has a differential electric signal output and the receive IDT has a differential electric signal input.

9. The wireless communication system of claim 8, wherein the code represents identification information.

10. The wireless communication system of claim 1, wherein the expander IDT has differential electric signal input terminals and the compressor IDT has differential electric signal output terminals.

11. The wireless communication system of claim 1, wherein the code is a Barker code.

12. The wireless communication system of claim 11, wherein the Barker code is a 5-bit Barker code.

13. The wireless communication system of claim 11, wherein the Barker code is a 13-bit Barker code.

14. The wireless communication system of claim 1, wherein the expander IDT and the compressor IDT each comprise:
   a. a pair of substantially parallel electrically conductive rails;
   b. one or more groups of interdigital elements, each group comprising a plurality of interdigital elements; and
   c. one or more SAW reflectors.

15. The wireless communication system of claim 14, wherein each interdigital element is connected to one of the rails and extends substantially perpendicular thereto toward the other rail.

16. The wireless communication system of claim 15, wherein the code is determined by a connection pattern of the interdigital elements in each group.

17. The wireless communication system of claim 14, wherein each reflector comprises a plurality of reflector grating elements.

18. The wireless communication system of claim 17, wherein the reflector grating elements of each reflector are connected to the other grating elements in the same reflector.

19. The wireless communication system of claim 1, wherein the compressor IDT performs a passive autocorrelation function on the coded SAW input based on the code to thereby produce the electric pulse output.

20. A passive wireless communication system comprising:
   a. an antenna for converting received communication signals into electric antenna output signals and for converting electric antenna input signals into communication signals;
   b. a first interdigital transducer (IDT) connected to the antenna and configured to produce a surface acoustic wave (SAW) output when a communication signal is received by the antenna;
   c. a second coded single phase unidirectional transducer (SPUDT) type IDT positioned adjacent to the first IDT and configured to produce an electric signal output when excited by the SAW output from the first IDT and to produce a coded SAW output when excited by an electric signal input; and d. a termination circuit connected across the terminals of the second IDT, wherein the termination circuit causes the second IDT to reflect a coded SAW output toward the first IDT in response to the SAW output produced by the first IDT; and the first IDT produces a coded electric signal as an antenna input signal in response to the reflected coded SAW output from the second IDT.

21. The passive wireless communication system of claim 20, wherein the termination circuit is a short circuit connection.

22. The passive wireless communication system of claim 20, wherein the termination circuit is an open circuit.

23. The passive wireless communication system of claim 20, wherein the first IDT is a SPUDT-type IDT.

24. The passive wireless communication system of claim 20, wherein the first IDT has a differential electrical input from and output to the antenna.

25. The passive wireless communication system of claim 20, wherein the code is a Barker code.

26. The passive wireless communication system of claim 20, wherein the code represents identification information.

27. The passive wireless communication system of claim 20, incorporated into an identification tag.

28. The passive wireless communication system of claim 20, incorporated into an adhesive label.

29. The passive wireless communication system of claim 20, incorporated into an equipment nameplate.

30. The passive wireless communication system of claim 20, wherein the first IDT and the second IDT operate at a frequency of 2.4 GHz.

31. The passive wireless communication system of claim 20, wherein the communication signals are received from a remote interrogation system.

32. The passive wireless communication system of claim 31, wherein the antenna converts the coded electric signal produced by the first IDT into a communication signal for transmission to the remote interrogation system.

33. The passive wireless communication system of claim 20, wherein the second IDT comprises:

a. a pair of substantially parallel electrically conductive rails;

b. one or more groups of interdigital elements, each group comprising a plurality of interdigital elements and each interdigital element being connected to one of the rails and extending substantially perpendicular thereto toward the other rail; and c. one or more SAW reflectors, wherein a connection pattern of the interdigital elements to the rails defines the code.

* * * * *

UNITED STATES PATENT AND TRADEMARK OFFICE
CERTIFICATE OF CORRECTION

PATENT NO.     : 6,462,698 B2
DATED          : October 8, 2002
INVENTOR(S)    : Campbell et al.

It is certified that error appears in the above-identified patent and that said Letters Patent is hereby corrected as shown below:

Column 8,
Line 17, "TOOHT™" should be -- TOOTH™ --

Signed and Sealed this

Twenty-fifth Day of March, 2003

JAMES E. ROGAN
*Director of the United States Patent and Trademark Office*